United States Patent [19]
Kang

[11] Patent Number: 5,937,313
[45] Date of Patent: Aug. 10, 1999

[54] METHOD OF FORMING QUANTUM WIRE FOR COMPOUND SEMICONDUCTOR

[75] Inventor: Joon-Mo Kang, Seoul, Rep. of Korea

[73] Assignee: Hyundai Electronics Industries Co., Ltd., Kyoungki-do, Rep. of Korea

[21] Appl. No.: 08/987,534

[22] Filed: Dec. 9, 1997

[30]    Foreign Application Priority Data

Dec. 11, 1996  [KR]   Rep. of Korea ............ 96-64250

[51] Int. Cl.$^6$ .................................. H01L 21/20
[52] U.S. Cl. .................. 438/478; 438/500; 438/507; 438/962
[58] Field of Search ................. 438/761, 763, 438/962, 46, 47, 478, 500, 507

[56]            References Cited

U.S. PATENT DOCUMENTS 5,548,129   8/1996   Kubena .

OTHER PUBLICATIONS

K. Boer, Survey of Semiconductor Physics, Van Nostrand Reinhold, p. 448 (no month given), 1990.

*Primary Examiner*—Charles Bowers
*Assistant Examiner*—Keith Christianson
*Attorney, Agent, or Firm*—Ware, Fressola, Van Der Sluys & Adolphson LLP

[57]            ABSTRACT

Disclosed is a method of forming quantum wires for compound semiconductors capable of forming a large number of quantum wires. Quantum wires for compound semiconductors according to the present invention are formed by the following processes. First, a compound semiconductor substrate is provided and $Al_xGa_{1-x}As$ layers and GaAs layers are then formed alternately on the substrate to predetermined times to form a quantum well. Next, a plurality of grooves are formed in the upper most GaAs layer to a predetermined depth wherein the grooves are separated with a predetermined space from each other. Stress is applied to the quantum well such that the $Al_xGa_{1-x}As$ layers surround the GaAs layers to thereby form a large number of quantum wires.

7 Claims, 4 Drawing Sheets

METHOD OF FORMING QUANTUM WIRE FOR COMPOUND SEMICONDUCTOR

BACKGROUND OF THE INVENTION

1. Field of the Invention

The present invention generally relates to a method of forming quantum wires for compound semiconductors used in optical communications, and more particularly to a method for forming quantum wires for compound semiconductors capable of forming a large number of quantum wires with quantum well.

2. Description of the Related Art

Multi-layer compound semiconductor structure can be grown into continuous single crystal layers wherein each single crystal layer has a different energy gap from its adjacent layers. For example, in case of a multi-layer structure of a GaAs layer having a narrower energy gap sandwiched between two AlGaAs layers having a wider energy gap, a spatial change arises in the conduction band and valence band of the GaAs layer. More specifically, at conduction band of the GaAs layer, electrons exist not at a normal conduction band level but at a quantum level of an potential well. If the quantum well is applied to a laser diode, the laser diode has the lower threshold current.

Recently, in order to enhance the efficiency of compound semiconductor devices having a quantum well, researches on quantum wire or quantum dot have been progressed. The quantum wires are formed by a selective epitaxial growth method on a GaAs substrate in which either one of groove or mesa is formed.

FIG. 1A through FIG. 1C are sectional views showing a conventional method of forming quantum wires.

As shown in FIG. 1A, a GaAs buffer layer 11 is formed on a GaAs substrate 10. On the GaAs buffer layer 11 are formed $Al_xGa_{1-x}As$ layers 12a, 12b, 12c, 12d and GaAs layers 13a, 13b, 13c, 13d in turn. Next, on the upper GaAs layer 13c is formed a photoresist film pattern 14 by photolithography.

As shown in FIG. 1B, the GaAs layers 13a, 13b, 13c, 13d and the $Al_xGa_{1-x}As$ layers 12a, 12b, 12c, 12d are mesa etched using the photoresist film pattern 14 as an etching mask. At this time, the lower $Al_xGa_{1-x}As$ layer 12a is etched to a selected thickness.

As shown in FIG. 1C, the photoresist film pattern 14 is removed by a well-known method. Next, a $Al_xGa_{1-x}As$ layer 15 is formed on the mesa etched portion by a selective epitaxial growth method, so that the $Al_xGa_{1-x}As$ layers 12a, 12b, 12c, 12d 15 surrounds the GaAs layers 13a, 13b, 13c, 13d whereby quantum wires are formed.

However, owing to the selective epitaxial growth method which has difficult growth conditions, the above described the conventional method of forming quantum wires has difficulty on manufacturing process. Further, in case the quantum wires are adapted to optical device, the optical device has the lower threshold current compared to the one having a quantum well since the active layer formed by the quantum wires has the smaller volume limited by the mesa or the groove. However, it is difficult to adapt the quantum wire in optical devices because of the weaken intensity of the laser. It is also difficult to produce a large number of quantum wires since they are formed by utilizing mesa or grooves.

SUMMARY OF THE INVENTION

The object of the present invention is to provide a method of forming quantum wires for compound semiconductors which is capable of increasing the volume of quantum wires and forming a large number of quantum wires using a quantum well.

Quantum wires for compound semiconductors according to the present invention are formed by the following processes. First, a compound semiconductor substrate is provided and $Al_xGa_{1-x}As$ layers and GaAs layers are then formed alternately on the substrate to predetermined times to form a quantum well. Next, a plurality of grooves are formed in the upper most GaAs layer to a predetermined depth wherein the grooves are separated with a predetermined space from each other. Stress is applied to the quantum well such that the $Al_xGa_{1-x}As$ layers surround the GaAs layers to thereby form a large number of quantum wires.

According to the present invention, $Al_xGa_{1-x}As$ layers and GaAs layers are formed to predetermined times alternately to form a quantum well and grooves are then formed in the quantum well to a predetermined depth. Therefore, the tensile stress applied to the quantum well is concentrated at the grooves. In result, the quantum well is transformed into a large number of quantum wires and the volume of the quantum wire increases.

DETAILED DESCRIPTION OF THE INVENTION

Hereinafter, a preferred embodiment of the present invention will be explained in more detail with reference to the accompanying drawings.

FIG. 2A through FIG. 2D are sectional views showing a method of forming quantum wires for compound semiconductors according to an embodiment of the present invention.

Figure 1A:
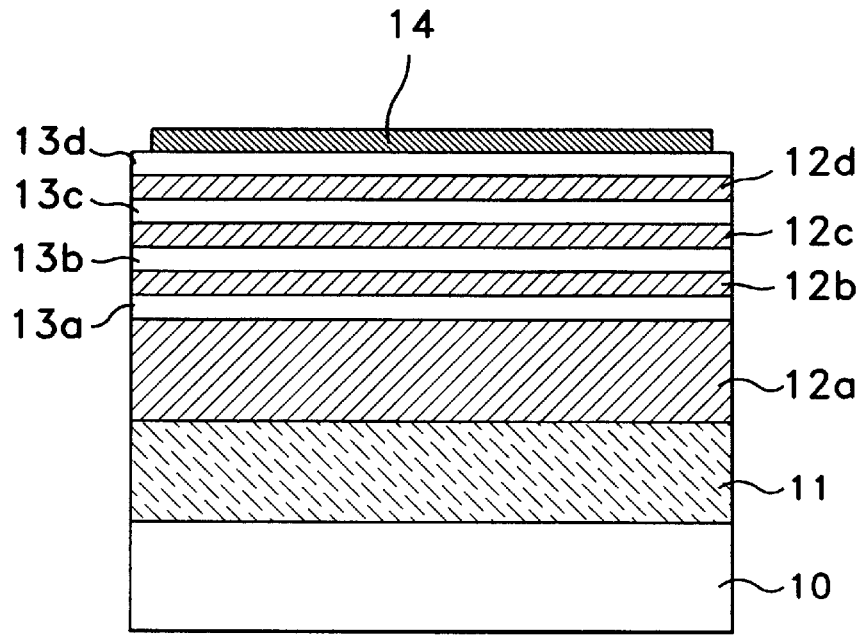
FIG. 1A through FIG. 1C are sectional views showing a conventional method of forming quantum wires for compound semiconductors.
Figure 1B:
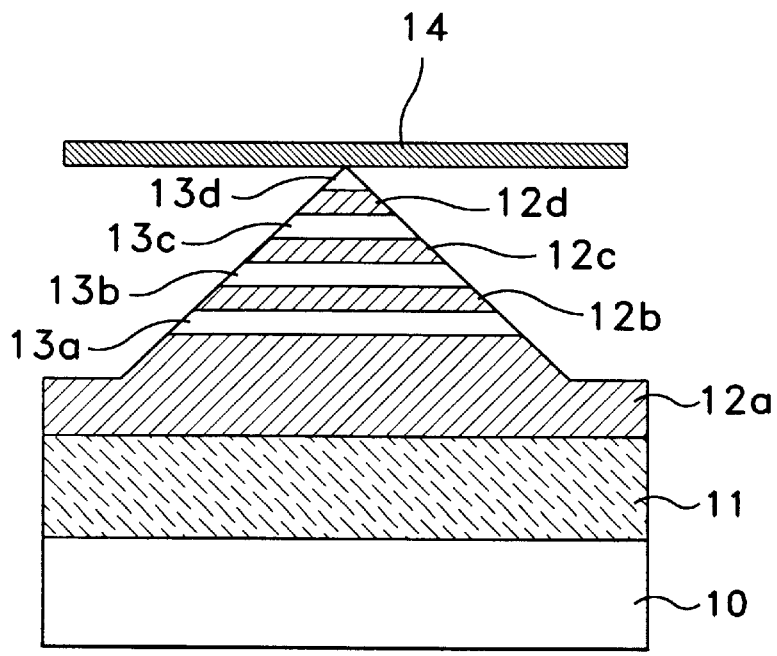
Figure 1C:
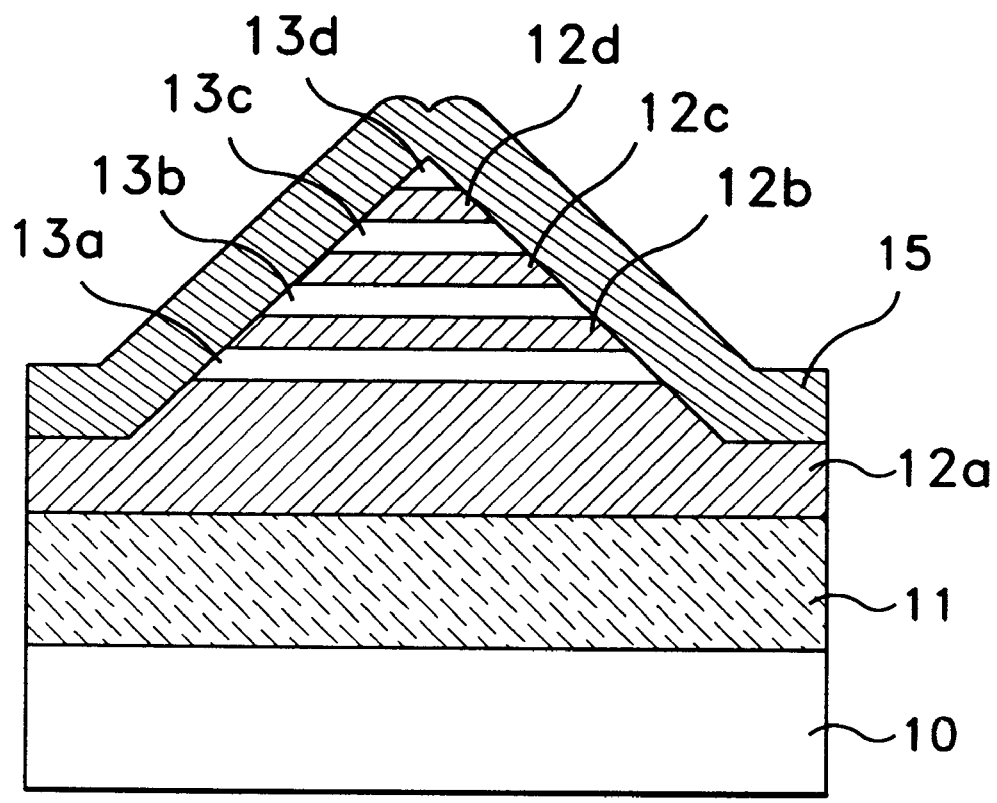
Figure 2A:
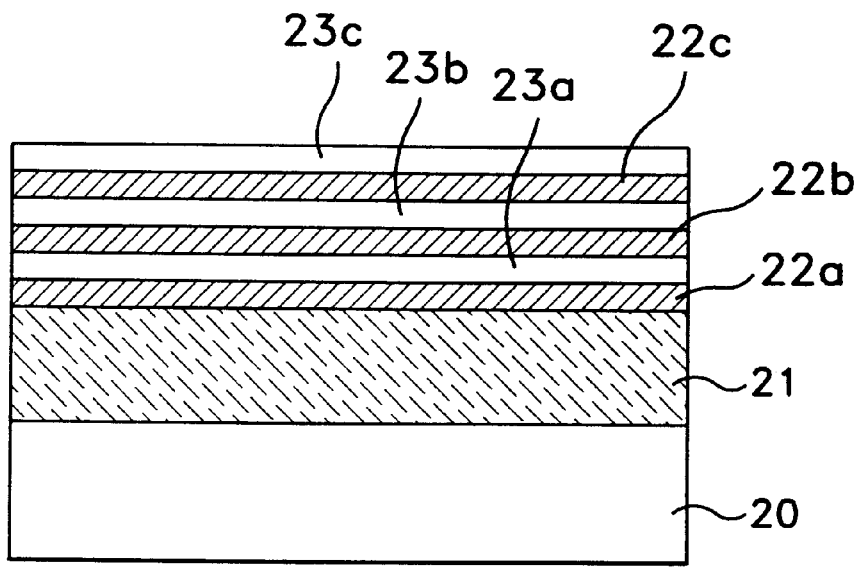
FIG. 2A through FIG. 2D are sectional views showing a method of forming quantum wires for compound semiconductors according to an embodiment of the present invention.

As shown in FIG. 2A, a GaAs buffer layer 21 is formed on a GaAs substrate 20. On the GaAs buffer layer 21 are formed $Al_xGa_{1-x}As$ layers(X=0.1–0.9) 22a, 22b, 22c and GaAs layers 23a, 23b, 23c alternately thereby forming a quantum well. Each of the $Al_xGa_{1-x}As$ layer and the GaAs layer is formed alternately to three times in the present embodiment. In this process, the above described compound semiconductor layers are formed by MBE(Molecular Beam Epitaxy) or MOCVD (Metal Organic Chemical Vapor Deposition) method.

Figure 2B:
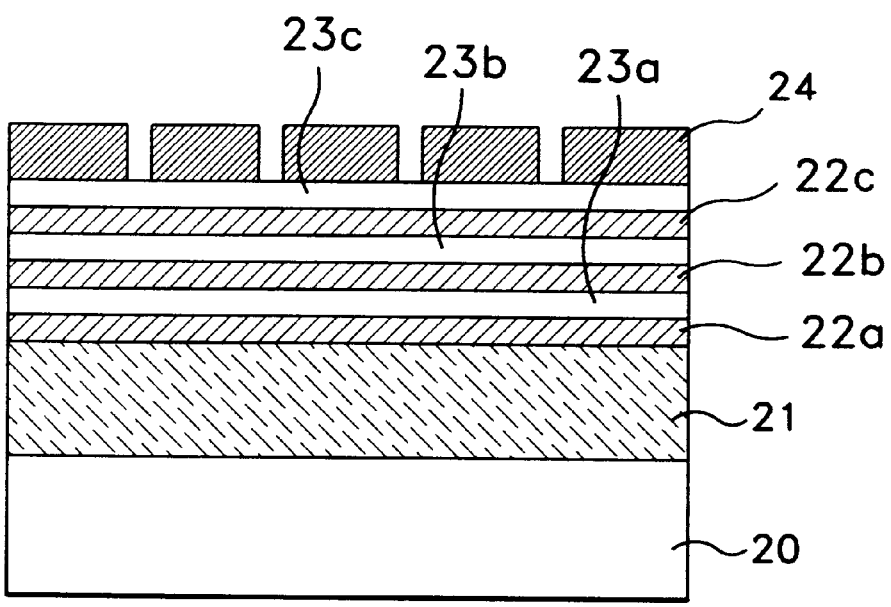
Figure 2C:
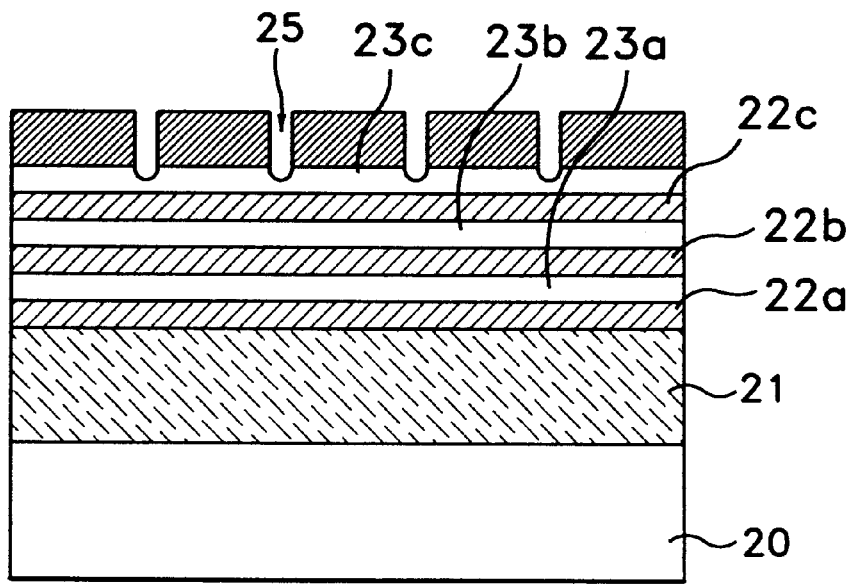

As shown in FIG. 2B, a photoresist film pattern 24 is formed on the GaAs layer 23c by photolithography such that the upper surface of the upper most GaAs layer 23c is exposed at predetermined portions. Next, as shown in FIG. 2C, the exposed GaAs layer 23c is etched to a predetermined depth using the photoresist film pattern 24 as an etching mask, thereby forming grooves 25 separated with a predetermined space from each other. The grooves 25 concentrate the stress applied in the later quantum wire forming process.

Figure 2D:
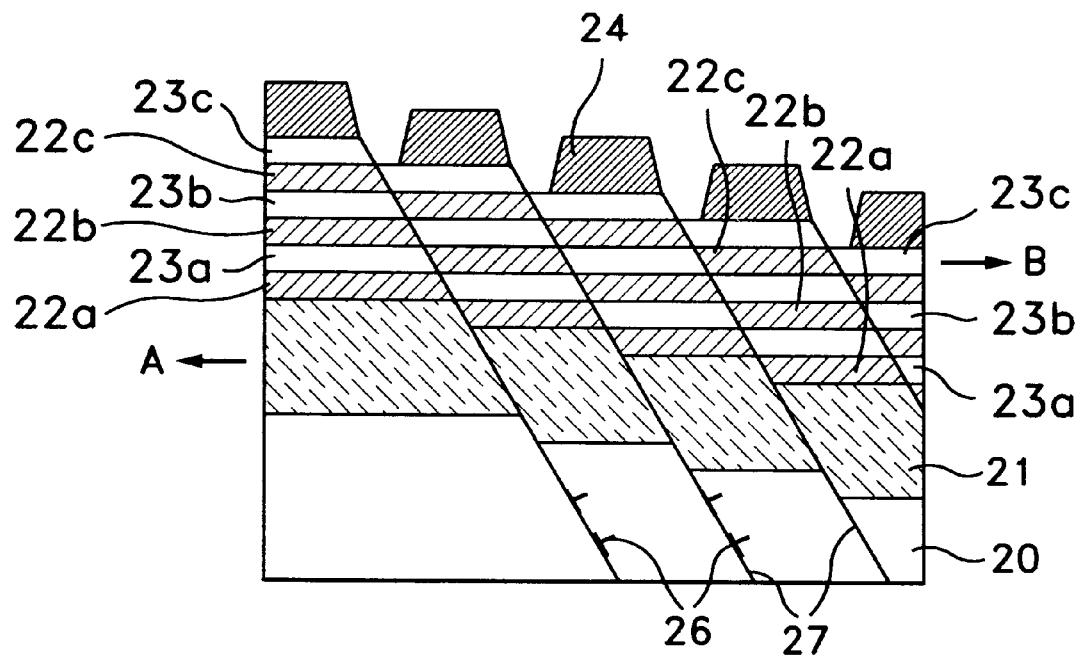

As shown in FIG. 2D, the photoresist film pattern 24 is removed by a well-known method. Next, a tensile stress is applied to the quantum well in A and B direction such that $Al_xGa_{1-x}As$ layers 22a, 22b, 22c are surround the GaAs layer 23a, 23b, thereby forming a large number of quantum wires. More specifically, if a tensile stress is applied to the quantum well, it is concentrated around the grooves 25 to generate a dislocation 26, i.e., distortion of lattice in the solid crystal. The dislocation 26 moves along glide planes 27 to cause movement of crystal. In result, the quantum well is transformed into the quantum wires due to the relative movement of the crystal.

According to the above described embodiment, $Al_xGa_{1-x}$As layers and GaAs layers are alternately formed to predetermined times in turns to form a quantum well and grooves are then formed in the quantum well to a predetermined depth. Therefore, the tensile stress applied to the quantum well is concentrated at the grooves. In result, the quantum well is transformed into a large number of quantum wires and the volume of the quantum wire increases. Accordingly, the quantum wires according to the present invention is easily adapted in optical devices.

While this invention has been described with reference illustrative embodiments, this description is not intended to be construed in a limiting sense. Various modifications of illustrative embodiments, as well as other embodiments of the invention, will be apparent to persons skilled in the art upon reference to this description. It is therefore contemplated that the appended claims will cover any such modifications of embodiments as falling within the true scope of the invention.

What is claimed is:

1. A method for forming quantum wires for compound semiconductor, comprising the steps of:

providing a compound semiconductor substrate;

forming $Al_xGa_{1-x}As$ layers and GaAs layers on the substrate alternately to predetermined times to form a quantum well;

forming a plurality of grooves in the upper most GaAs layer to a predetermined depth wherein the grooves are separated with a predetermined space from each other; and applying stress to the quantum well such that the $Al_xGa_{1-x}$As layers surround the GaAs layers to thereby form a large number of quantum wires.

2. The method as claimed in claim 1, wherein the step of forming a plurality of grooves comprises the steps of:

forming a photoresist film pattern on the upper most GaAs layer such that predetermined portions of the upper most GaAs layer is exposed;

etching the exposed GaAs layer to a predetermined depth using the photoresist film pattern as an etching mask; and removing the photoresist film pattern.

3. The method as claimed in claim 1, wherein the $Al_xGa_{1-x}$As layers and the GaAs layers are formed by MBE method.

4. The method as claimed in claim 1, wherein the $Al_xGa_{1-x}$As layers and the GaAs layers are formed by MOCVD method.

5. The method as claimed in claim 1, wherein the stress is a tensile stress.

6. The method as claimed in claim 1, wherein the $Al_xGa_{1-x}$As and the GaAs layer are formed alternately to three or more times.

7. The method as claimed in claim 1, wherein the compound semiconductor substrate is a GaAs substrate on which a GaAs buffer layer is formed.

* * * * *